United States Patent [19]

Otomo et al.

[11] Patent Number: 5,463,518
[45] Date of Patent: Oct. 31, 1995

[54] MAGNETIC HEAD AND MAGNETIC RECORDING AND REPRODUCING APPARATUS USING A SUPERCONDUCTING QUANTUM INTERFERENCE DEVICE

[75] Inventors: Shigekazu Otomo, Sayama; Noriyuki Kumasaka, Ome; Kazuo Shiiki, Kanagawa; Takeo Yamashita, Tachikawa; Noritoshi Saito, Miyagi; Yoshinobu Tarutani, Yamanashi, all of Japan

[73] Assignee: Hitachi, Ltd., Tokyo, Japan

[21] Appl. No.: 673,866

[22] Filed: Mar. 22, 1991

Related U.S. Application Data

[63] Continuation of Ser. No. 184,028, Apr. 20, 1988, abandoned.

[30] Foreign Application Priority Data

| Apr. 20, 1987 | [JP] | Japan | 62-095131 |
| May 27, 1987 | [JP] | Japan | 62-128134 |

[51] Int. Cl.$^6$ ............ G11B 5/147; G01R 33/02; G01C 21/08
[52] U.S. Cl. ............ 505/171; 360/84; 360/126; 324/248; 505/843
[58] Field of Search ............ 360/110, 103–106, 360/125, 126; 505/1, 829, 832, 833, 843, 845, 846; 324/248

[56] References Cited

U.S. PATENT DOCUMENTS

| 4,064,029 | 12/1977 | Wu et al. | 324/248 |
|---|---|---|---|
| 4,224,630 | 9/1980 | Kroger | 324/248 |
| 4,324,255 | 4/1982 | Barach et al. | 324/248 |
| 4,491,795 | 1/1985 | Gelinas | 324/248 |
| 4,549,135 | 10/1985 | Vaidya | 324/248 |
| 4,567,438 | 1/1986 | Gershenson et al. | 324/248 |
| 4,687,987 | 8/1987 | Kuchnir et al. | 505/843 |
| 4,689,559 | 8/1987 | Hastings et al. | 324/248 X |
| 4,761,611 | 8/1988 | Hoenig | 324/248 |
| 4,801,882 | 1/1989 | Daalmans | 324/248 |
| 4,804,915 | 2/1989 | Hoenig | 324/248 |
| 4,843,504 | 6/1989 | Barnes | 360/106 |
| 4,926,082 | 5/1990 | Barnes | 505/1 |
| 4,927,804 | 5/1990 | Zieren et al. | 505/1 |
| 4,935,403 | 6/1990 | Yamaoki et al. | 505/1 |
| 4,971,947 | 11/1990 | Barnes et al. | 505/1 |
| 4,996,621 | 2/1991 | Ruigrok et al. | 360/126 |
| 5,016,128 | 5/1991 | DiIorio et al. | 360/97.01 |

FOREIGN PATENT DOCUMENTS

| 57-120221 | 7/1982 | Japan | 360/125 |
|---|---|---|---|
| 60-154315 | 8/1985 | Japan | 360/125 |
| 63-261503 | 10/1988 | Japan | 360/113 |
| 63-246688 | 10/1988 | Japan | 365/162 |
| 1139677 | 2/1989 | Japan | 360/103 |

OTHER PUBLICATIONS

IEEE Transactions on Electron Devices, vol. EDL–22, No. 10, Oct. 80, pp. 1894–1908, "Advances in Squid Magnetometers" by John Clarke MRS, High Temperature Superconductors, Apr. 23–24, 1987, pp. 81–84.

*Primary Examiner*—Robert S. Tupper
*Assistant Examiner*—Jefferson Evans
*Attorney, Agent, or Firm*—Antonelli, Terry, Stout & Kraus

[57] ABSTRACT

A magnetic head has a superconducting quantum interference device having a ring made of a superconductive material including a Josephson junction which links to a magnetic flux generated by a magnetic recording medium, and a magnetic pole for guiding the magnetic flux generated by the magnetic recording medium or the ring made of a superconductive material arranged in parallel to a plane of the magnetic recording medium so that the magnetic flux generated by the magnetic recording medium flows into a through-hole of the ring. A magnetic recording and reproducing apparatus includes such a magnetic head, a winding to which a reproduced signal from the magnetic head is applied and the superconductive ring including the Josephson junction arranged such that the magnetic flux generated by the winding flows thereto.

30 Claims, 11 Drawing Sheets

FIG. IA
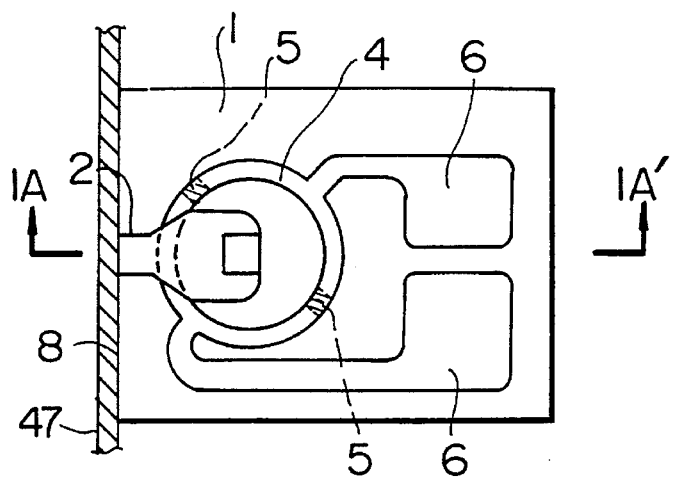
FIG. IB
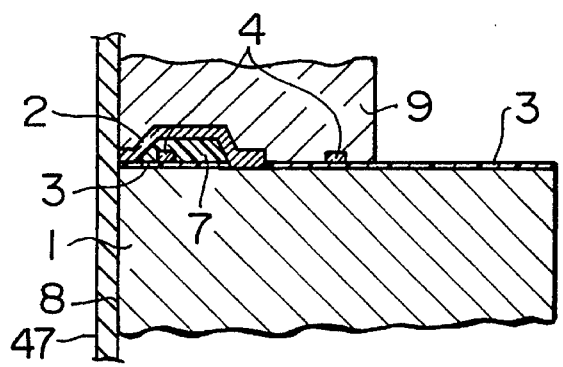
FIG. 2
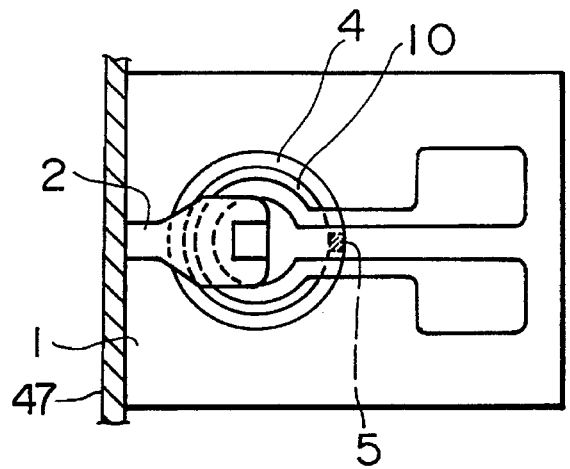

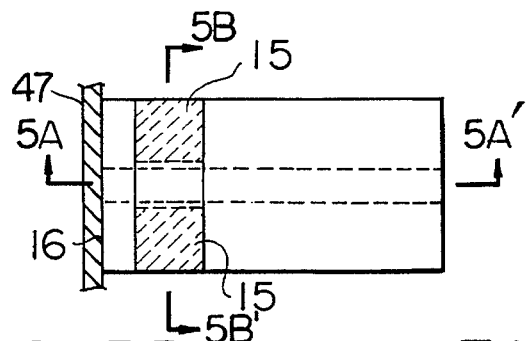
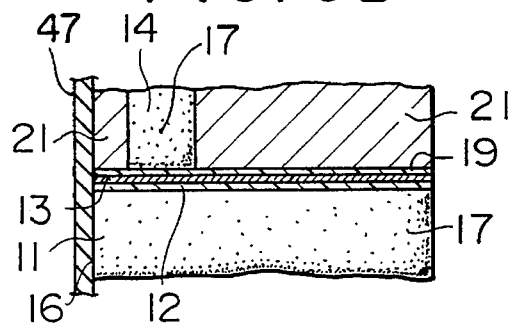
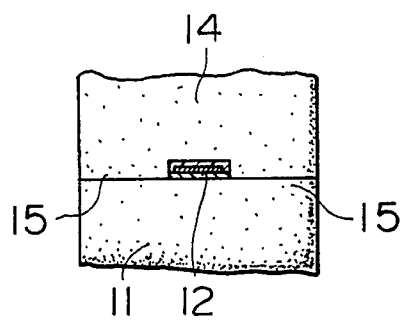
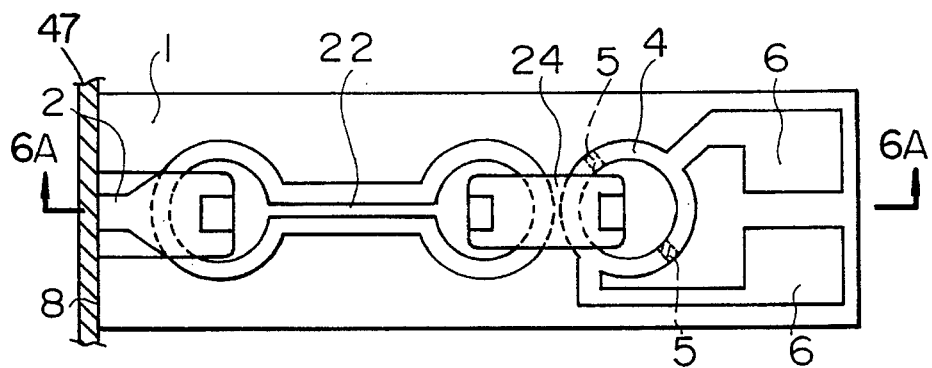
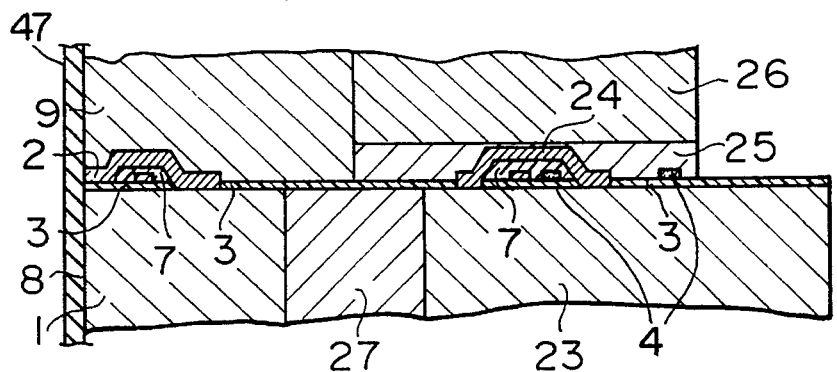

FIG. 14
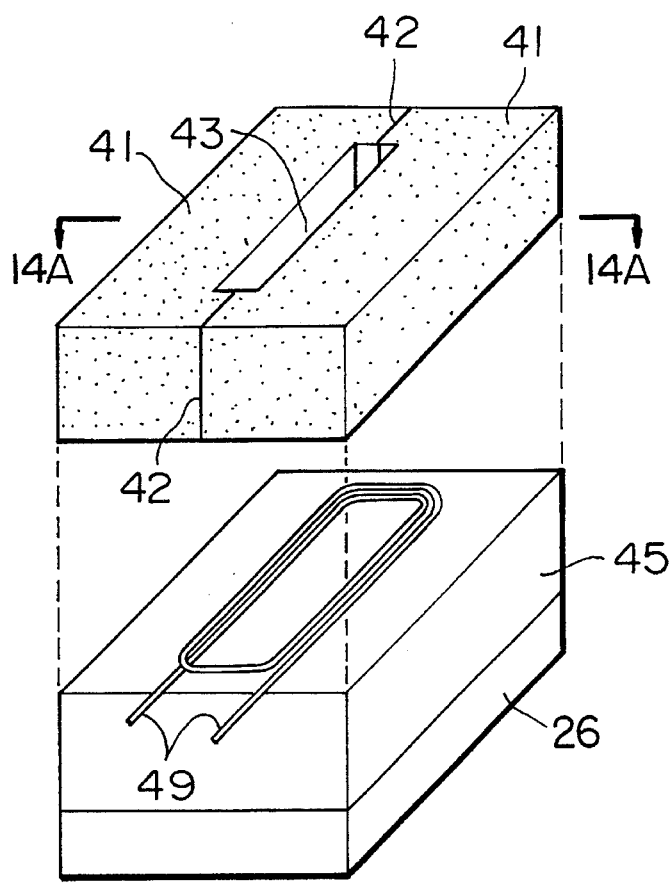
FIG. 15          FIG. 16
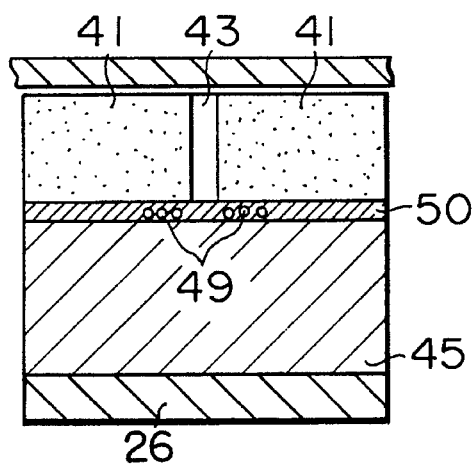 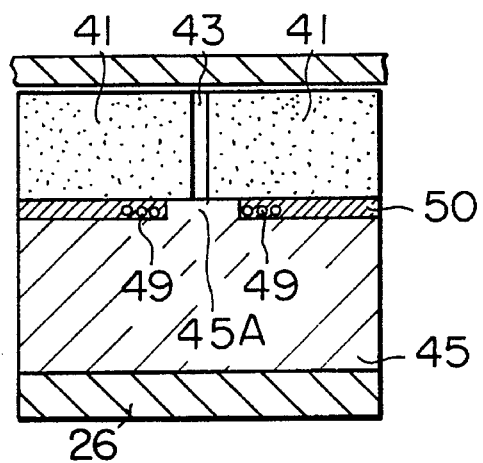

MAGNETIC HEAD AND MAGNETIC
RECORDING AND REPRODUCING
APPARATUS USING A SUPERCONDUCTING
QUANTUM INTERFERENCE DEVICE

This application is a Continuation of application Ser. No. 184,028, filed Apr. 20, 1988 now abandoned.

BACKGROUND OF THE INVENTION

The present invention relates to magnetic head and magnetic recording and reproducing apparatus, and more particularly to ultra-high sensitivity reproducing magnetic head and magnetic recording and reproducing apparatus using superconducting quantum interference.

Advancement in high density magnetic recording is remarkable, and study on perpendicular magnetic recording suitable to high density magnetic recording is under progress. Further, in conventional longitudinal magnetic recording, high density recording is in progress due to improvement of magnetic head and recording medium.

Where linear recording density and track density are increased, a related area of the recording medium per bit or per wavelength decreases and a reproduced output decreases. Thus, if perpendicular magnetic recording is used, a signal having a linear recording density of up to 500 KBPI can be recorded. However, when the recorded signal is reproduced by a conventional magnetic head, an output is very low compared to a low recording density because a magnetic flux generated by magnetization of the signal of the medium is small. (See Papers of Lecture of Tenth Japan Applied Magnetic Institute, (1986) p. 335)

SUMMARY OF THE INVENTION

It is an object of the present invention to provide very high sensitivity reproducing magnetic head and magnetic recording and reproducing apparatus using a superconducting quantum interference device, which can reproduce a signal of high linear recording density and high track density.

In order to achieve the above object, the magnetic head of the present invention has a magnetic path for guiding a reproduced magnetic flux and a superconductive ring for forming a superconducting quantum interference device which links to the magnetic path. The superconducting quantum interference device is used as means for detecting the magnetic flux. The superconducting quantum interference device measures quantity of magnetic flux by utilizing a phenomenon that a superconducting current flowing through the ring changes in accordance with quantity of magnetic flux which passes through a superconductive ring including one or two Josephson junctions.

Since the superconducting quantum interference device utilizes the superconducting state, it is necessary to construct the elements by superconductive material and cool the elements to a cryogenic temperature to attain the superconducting state. Recent advancement in the research and development of the superconductive material is remarkable and a material which exhibits superconductivity at approximately 95° K. has been found. By using such a high temperature superconductive material, it is possible to provide a very high sensitivity recording magnetic head which uses a superconducting quantum interference device.

The magnetic recording and reproducing apparatus of the present invention uses the superconducting quantum interference device as means for detecting a signal reproduced by a magnetic head to allow very high sensitivity reproduction of the signal.

The magnetic head of the present invention comprises at least a magnetic path for guiding a reproduced magnetic flux and a superconductive ring for forming the superconducting quantum interference device which links to the magnetic path. By using a cooling device which utilizes the Peltier effect, it is possible to efficiently cool a desired portion to maintain the superconductivity. By separating the portion to be cooled from a surface of the head which faces the recording medium, the cooling is facilitated. To this end, a conventional coil which links to the magnetic path for guiding the reproduced magnetic flux and another magnetic path which links to the coil may be provided so that the magnetic flux of the other magnetic path links to the superconducting quantum interference device. Because of high sensitivity of the superconducting quantum interference device, it is possible to link the superconducting quantum interference device to the magnetic flux of the coil which links to the magnetic path for the reproducing magnetic flux, without forming the additional magnetic path.

In the magnetic head of the present invention, the magnetic path for guiding the reproducing magnetic flux may be of ring shape or may be constructed by a thin main magnetic pole film like a single magnetic pole head for perpendicular magnetic recording.

A conventional head needs a multi-turn coil to improve the reproducing sensitivity. In accordance with the present invention, one ring of the superconductive material is used and the process is significantly simplified.

The superconducting quantum interference device used in the present invention may be a DC type which includes two Josephson junctions or an AC type which includes one Josephson junction. Since the DC type must form two Josephson junctions, it is disadvantageous in process compared to the AC type which includes one Josephson junction, but a circuit configuration of the DC type is simpler. On the other hand, the AC type includes only one Josephson junction and hence it is advantageous in process but the circuit configuration is more complex. The magnetic head of the present invention may be of either type to selectively use the advantages of the respective types. Since the superconducting quantum interference device used in the magnetic head of the present invention is very highly sensitive to the external magnetic flux, it is also sensitive to an external leakage magnetic flux other than the signal and a noise such as an electromagnetic wave. In order to overcome the above problem, it is desirable to apply a shield to the magnetic head of the present invention. The shielding material may be a high permeability material such as Ni—Fe alloy (permalloy) or amorphous alloy. Since a magnetic flux does not penetrate into the superconducting material, it is most desirable to use the superconductive material as the shielding material.

In the magnetic head of the present invention, the biasing coil is arranged such that the magnetic flux thereof links to the superconducting quantum interference device and the AC biasing current is supplied thereto to facilitate the detection of the signal.

The superconducting material used for the magnetic head of the present invention may be one which has composition of $(Sr_xLa_{l-x})_2CuO_4$ (x=0.05–0.1) or $(Ba_{l-x}Y_x)_3Cu_2O_7$ (x–0.3) The latter is preferable because it exhibits superconductivity at a high temperature of 95° K.

In the magnetic head of the present invention, the recording coil is arranged to link to the magnetic path of the magnetic head so that it may also be used as a recording head. As the recording coil, the biasing coil or an RF coil for detecting a signal used in the AC superconducting quantum interference device may be used during recording operation. The superconductive material may be used as the material for the coil so that a heat generated by the recording current is suppressed to minimum and an excellent recording head is provided.

In the magnetic head of the present embodiment, no magnetic path for guiding the reproducing magnetic flux may be provided and the magnetic flux from the medium is flown into a through-hole of the superconducting quantum interference device. In the present magnetic head, the quantity of magnetic flux which flows into the superconducting quantum interference device is smaller than that where the magnetic path is provided, but the present magnetic head is operable because the superconducting quantum interference device can detects very small amount of magnetic flux.

In the magnetic head of the present invention, the surface of the superconductive ring of the superconducting quantum interference device is substantially parallel to the plane of the recording medium, the through-hole of the superconductive ring into which the magnetic flux is to flow is of an elongated rectangular shape, a longer side of the rectangular hole corresponds to a track width and a shorter side corresponds to a pole thickness of a perpendicular recording single magnetic pole head. The shorter side of the rectangular hole corresponds to a gap length of a conventional ring-shape head. The superconductive ring may be made of thin film or bulk material. By providing the cooling element which utilizes the Peltier effect, the superconductive ring may be efficiently cooled so that it is maintained in the superconductive state. In the magnetic head of the present invention, the penetration of unnecessary magnetic flux is prevented because the superconductive ring per se serves as a magnetic shielding material.

The magnetic recording and reproducing apparatus of the present invention comprises the coil for transforming the reproduced signal derived from the magnetic head to the magnetic flux, and the superconductive ring forming the superconducting quantum interference device which links to the coil. In order to efficiently transfer the magnetic flux from the coil to the superconductive ring, it is effective to provide the magnetic path of the magnetic material. By providing the cooling element which utilizes the Peltier effect, the desired parts can be efficiently cooled so that they are kept in the superconductive state. Like the magnetic head described above, the magnetic recording and reproducing apparatus of the present invention may use either DC or AC superconducting quantum interference device. It is advisable to apply a shield of a high permeability material, preferably a superconductive material around the superconducting quantum interference device. A biasing coil may be provided to facilitate the signal detection.

In the magnetic recording and reproducing apparatus of the present invention, the superconducting quantum interference device is inserted between the magnetic head and a signal detection circuit to detect a very weak signal from the magnetic head. In the VTR apparatus of the magnetic recording and reproducing apparatus, the head is mounted on a cylinder rotating at a high speed to record and reproduce signals. Accordingly, a signal transfer element such as a rotary transformer is inserted between the head and the record detection circuit. In the magnetic recording and reproducing apparatus of the present invention, the rotary transformer is constructed by the superconducting quantum interference device to significantly enhance the reproducing sensitivity.

The magnetic recording and reproducing apparatus of the present invention is applicable not only to the VTR but also to other magnetic recording and reproducing apparatus comprising the recording medium and the magnetic head such as audio tape recorder, rigid disk device, floppy disk device or computer magnetic tape storage device.

BRIEF DESCRIPTION OF THE DRAWINGS

FIG. 1A is a plan view of one embodiment of a magnetic head of the present invention, FIG. 1B shows an A–A' sectional view of FIG. 1A, FIG. 2 is a plan view of another embodiment of the magnetic head of the present invention, FIG. 5A shows a plan view of other embodiment of the magnetic head of the present invention, FIG. 5B shows an A–A' sectional view of FIG. 5A, FIG. 5C shows a B–B' sectional view of FIG. 5A, FIG. 6A shows a plan view of other embodiment of the magnetic head of the present invention, FIG. 6B shows an A–A' sectional view of FIG. 6A, FIG. 14 shows a developed perspective view of other embodiment of the magnetic head of the present invention, FIG. 15 shows an A–A' sectional view of FIG. 14, FIG. 16 shows a sectional view of other embodiment of the magnetic head of the present invention.

DESCRIPTION OF THE PREFERRED EMBODIMENTS

Figure 3A:
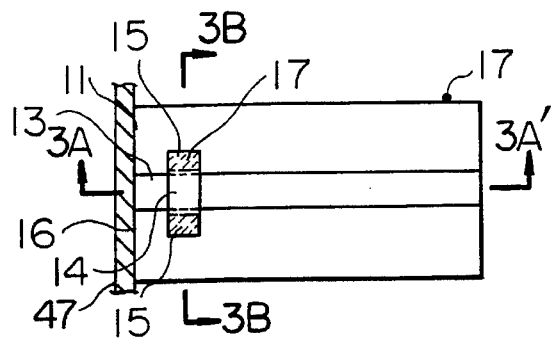
FIG. 3A is a plan view of other embodiment of the magnetic head of the present invention.

The magnetic head of the present invention is now explained in detail by preferred embodiments.

FIG. 1 shows a combination of a ring-shaped magnetic head and a DC superconducting quantum interference device which includes two Josephson junctions. FIG. 1A shows a plan view with a protection material for the head being removed, and FIG. 1B shows an A–A' sectional view of FIG. 1A. The present head comprises a substrate 1 made of a magnetic material such as Mn—Zn ferrite, a magnetic pole 2 made of a magnetic alloy formed thereon, and an insulator 3 which forms a magnetic gap. A ring 4 of a superconductive material is arranged to link to a magnetic path of the head, a Josephson junction 5 is formed in the ring, and terminals 6 are formed to construct a DC superconducting quantum interference device. An insulating material 7 is filled between the magnetic pole 2 and the ring 4. A protecting member 9 is jointed so that it slides on a magnetic recording medium on a surface 8 of the head which faces the recording medium.

FIG. 2 shows an embodiment of the magnetic head which is a combined with an AC superconducting quantum interference device. In the present embodiment, the superconductive ring 4 includes one Josephson junction 5, and an RF coil 10 for detecting a signal is magnetically coupled to the superconductive ring 4. The reproducing magnetic head having the superconducting quantum interference device has a magnetic pole 2 arranged such that a reproducing magnetic flux passes through the superconductive ring 4 of the superconducting quantum interference device so that even a very low magnetic flux penetrated into the head can be detected.

Figure 3B:
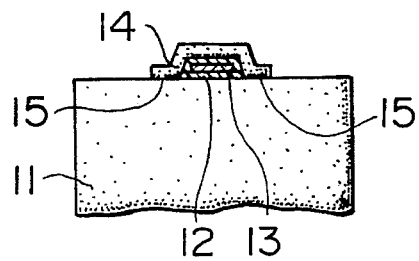
FIG. 3B shows a B–B' sectional view of FIG. 3A.
Figure 3C:
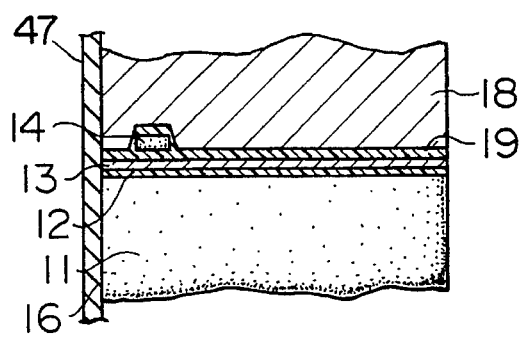
FIG. 3C shows an A–A' sectional view of FIG. 3A.

FIGS. 3A–3C show an embodiment of the head which is a combination of a single magnetic pole magnetic head and a superconducting quantum interference device. FIG. 3A shows a plan view of the head, and FIG. 3B shows a B–B' sectional view of FIG. 3A. Numeral 11 denotes a superconductive substrate on which an insulating material 12 is applied and a thin main magnetic pole film 13 made of a magnetic alloy is formed thereon to construct the single magnetic pole head. A superconductive material 14 is formed to cover it and two Josephson junctions 15 are formed between the superconductive material 14 and the superconductive substrate 11 to construct a DC superconducting quantum interference device. Numeral 16 denotes a plane which faces a recording medium. A fine magnetic flux from the medium is guided by the main magnetic pole film 13, passes through the superconductive ring constructed by the substrate 11 and the superconductive material 14, and a signal is detected by a signal line 17 connected to the substrate 11 and the superconductive material 14. Since the plane 16 of the present head slides on the recording medium, it is desirable to provide a protective material 18 as shown in FIG. 3C to protect the main magnetic pole film 13. FIG. 3C shows an A–A' sectional view of FIG. 3A. The protective material 18 may be a non-magnetic material, however, when a high permeability material such as Mn—Zn ferrite is used, it serves as a return path for the magnetic flux penetrated into the main magnetic pole film 13 so that a reproducing efficiency is enhanced. In this case, it is necessary to arrange a non-magnetic material 19 between the main magnetic pole film 13 and the protective material 18 to prevent magnetic shorting between the protective material 18 and the main magnetic pole film 13 in a vicinity of the plane facing the recording medium. When a superconductive material is used as the protective material, perfect magnetic shield is attained. In this case, the material 19 should be an insulative material.

Figure 4:
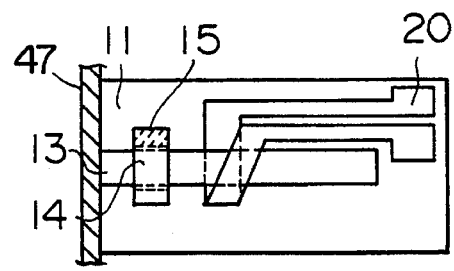
FIG. 4 shows a plan view of other embodiment of the magnetic head of the present invention.

FIG. 4 shows an embodiment which uses an AC superconducting quantum interference device in the magnetic head shown in FIG. 3. One Josephson junction 15 is formed between the superconductive substrate 11 and the superconductive material 14 and another junction is shorted. An RF coil 20 is arranged such that a magnetic flux links to the superconductive ring through the main magnetic pole film 13 so that a signal is detected.

FIGS. 5A–5C show other embodiment of the single magnetic pole magnetic head. FIG. 5A shows a plan view, FIG. 5B shows an A–A' sectional view of FIG. 5A and FIG. 5C shows a B–B' sectional view of FIG. 5A. In the head shown in FIGS. 5A–5C, the protective material 18 of FIG. 3C forms a portion of the superconducting ring of the superconducting quantum interference device. The superconductive material 14 is joined to the superconductive substrate 11 to form the Josephson junction 15. Numeral 21 denotes a non-magnetic material which serves to protect the main magnetic pole film 13.

FIG. 6A shows an embodiment of the head in which a portion of the superconducting quantum interference device of the head shown in FIG. 1A is away from the plane facing the recording medium. FIG. 6A shows a plan view with a protective material being removed, and FIG. 6B shows an A–A' sectional view of FIG. 6A. In the present head, like a conventional ring head, a leakage magnetic flux from a recording medium flows through a magnetic path comprising a magnetic substrate 1 and a magnetic pole 2, and it is transformed to a signal current by a magnetic flux transfer coil 22 which links to the magnetic path, a magnetic flux is generated in a rear magnetic path comprising a rear substrate 23 and a rear magnetic pole 24, and a signal is detected by a superconductive ring 4. Since the portion made of the superconductive material can be separated from a portion which slidably contacts to the recording medium, only the portion made of the superconductive material may be cooled. In the head shown in FIGS. 6A and 6B, a cooling element 26 which utilizes the Peltier effect is attached to the superconductive material portion through a highly thermal conductive material 25 to efficiently cool the superconductive material portion. In this case, it is advisable to thermally separate the substrate 1 which forms a front magnetic path and the substrate 23 which forms a rear magnetic path by an insulative material 27.

Figure 7:
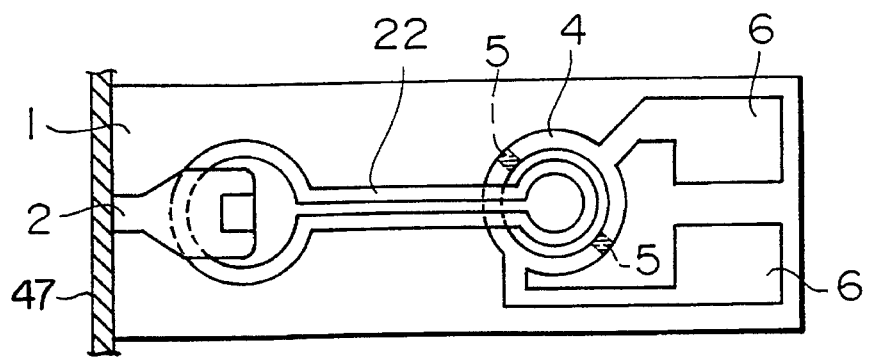
FIG. 7 shows a plan view of other embodiment of the magnetic head of the present invention.

FIG. 7 shows an embodiment in which the rear magnetic path of the head shown in FIGS. 6A and 6B is omitted and a coil 22 which transmits a reproduced signal and a superconductive ring 4 are magnetically coupled through a space. Since the superconducting quantum interference device exhibits a high sensitivity to the magnetic flux, the above arrangement is permitted. In the heads shown in FIGS. 6A, 6B and 7, only the DC superconducting quantum interference device is shown, although the AC superconducting quantum interference device may be used as shown in FIG. 2.

Figure 8A:
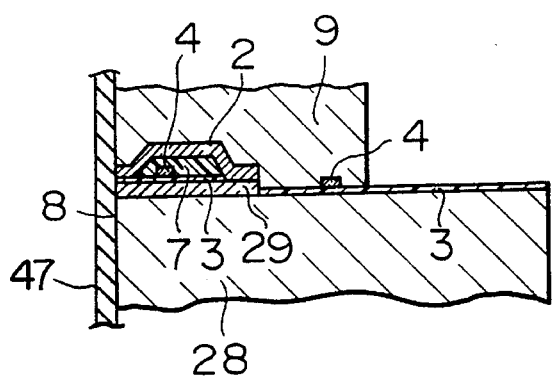
FIG. 8A shows a sectional view of other embodiment of the magnetic head of the present invention.
Figure 8B:
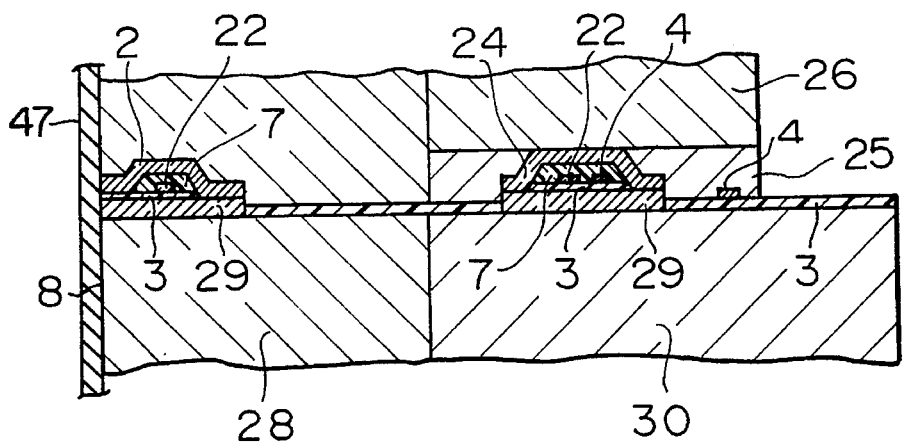
FIG. 8B shows a sectional view of other embodiment of the magnetic head of the present invention.

FIGS. 8A and 8B show an embodiment in which a magnetic path is made of only a magnetic alloy. A non-magnetic material substrate 28 is used in place of the magnetic material substrate 1 of FIGS. 1B and 6B, and a lower magnetic pole 29 is arranged thereon. In FIG. 8B, a substrate on which a rear magnetic path 24 and a superconductive material 4 are formed is made of a cooling element 30 which utilizes the Peltier effect so that a head having a high cooling efficiency and stable superconducting state is provided.

Figure 9A:
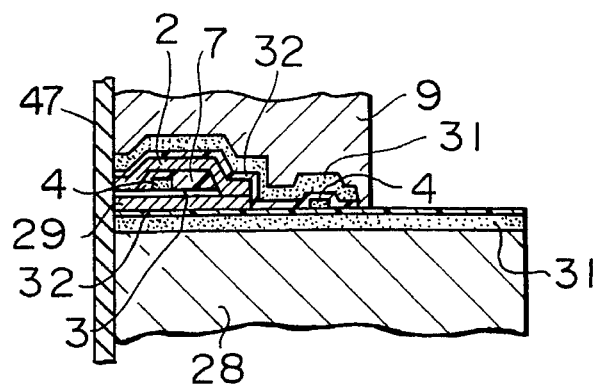
FIG. 9A shows a sectional view of other embodiment of the magnetic head of the present invention.
Figure 9B:
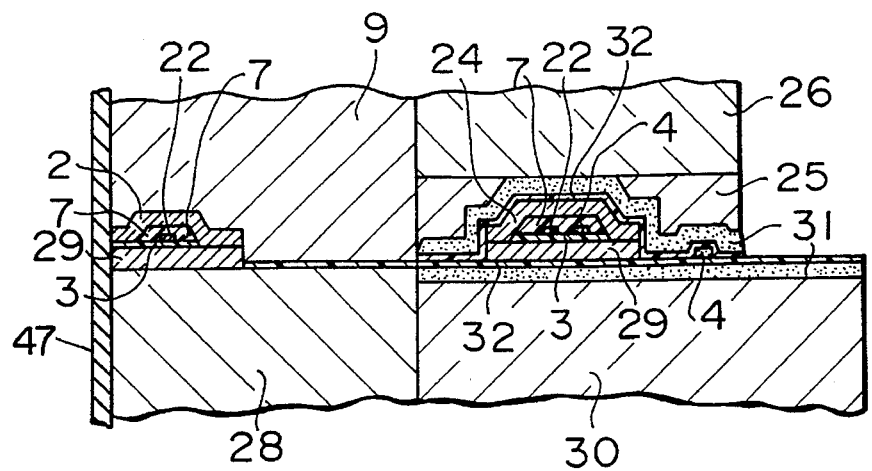
FIG. 9B shows a sectional view of other embodiment of the magnetic head of the present invention.

FIGS. 9A and 9B show an embodiment in which a magnetic shield is provided in a superconducting quantum interference device portion of the head of FIGS. 8A and 8B. Since the superconducting quantum interference device exhibits a very high sensitivity to a magnetic flux, it is advisable to provide a magnetic shield in order to prevent generation of noise. The magnetic shield material may be a conventional high permeability material but a perfect magnetic shield is attained by providing magnetic shields 31 of superconductive material above and below the magnetic pole of FIGS. 9A and 9B. In this case, it is necessary to provide an insulative material 32 between the magnetic shields 31 and each of the magnetic poles 2, 24 and 29.

Figure 10:
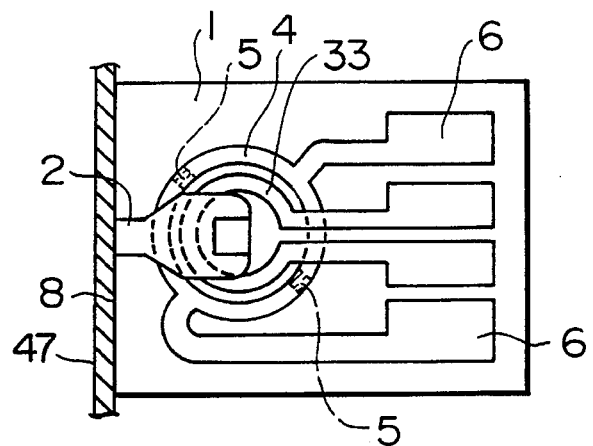
FIG. 10 shows a plan view of other embodiment of the magnetic head of the present invention.

FIG. 10 shows an embodiment in which a biasing coil 33 is added to the superconducting quantum interference device of the magnetic head shown in FIG. 1. By providing the biasing coil 33 in the magnetic head, the detection of the signal by the superconducting quantum interference device and the signal processing are facilitated. Such a biasing coil may be added to any magnetic head having the DC superconducting quantum interference device to attain the same effect.

The present invention primarily intends to provide a head having an excellent reproducing characteristic, but the present head may be used as a recording head. In this case, the superconductive ring of the superconducting quantum interference device may be used as a recording current application coil, but preferably the RF coils 10 and 20 of the head of FIGS. 2 and 4 and the biasing coil 33 of the head of FIG. 10 may be used as the recording current application coil. The material of the recording coil may be conventional Cu, Al or an alloy thereof but a superconductive material is preferable because the heat generation of the coil can be minimized even if a high density recording current is supplied thereto.

Figure 11:
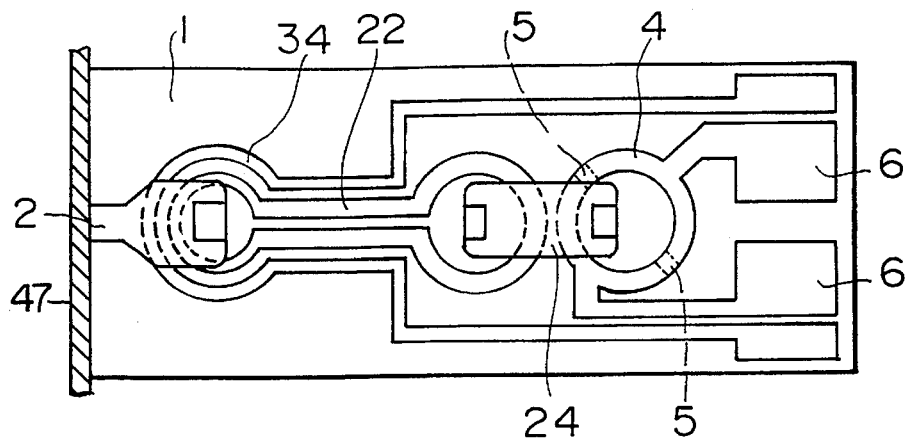
FIG. 11 shows a plan view of other embodiment of the magnetic head of the present invention.

FIG. 11 shows a magnetic head having a recording current application coil 34.

In the embodiments of the present invention, the RF coil, biasing coil, recording coil and magnetic flux transfer coils are of one-turn type although they may be of multi-turn type in which case more excellent characteristic may be attained.

Figure 12:
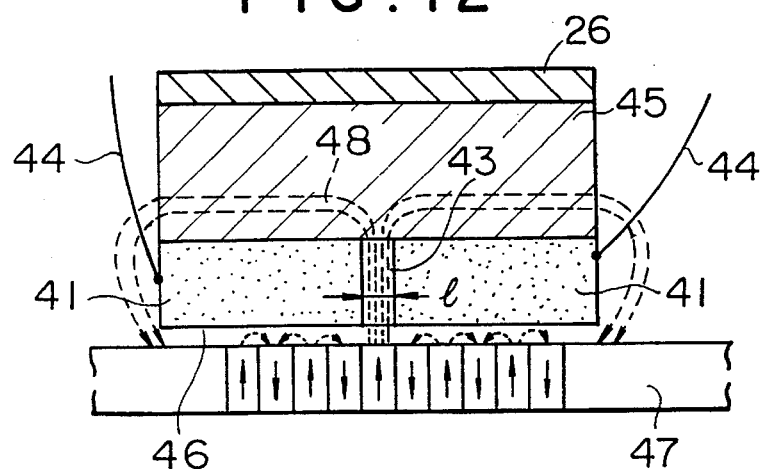
FIG. 12 shows a sectional view of other embodiment of the magnetic head of the present invention.
Figure 13:
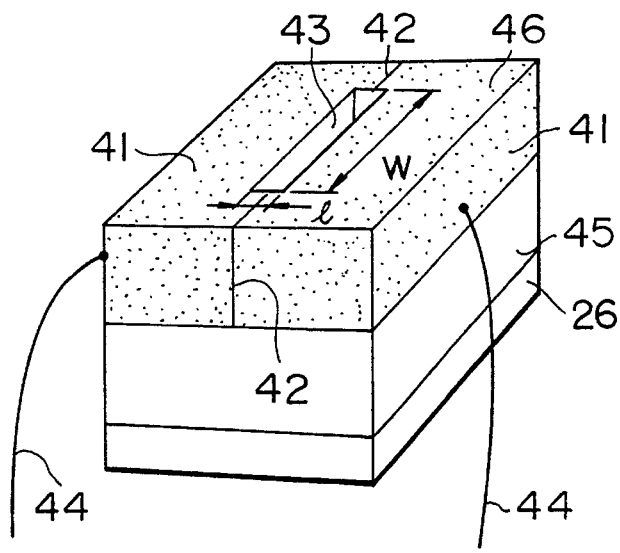
FIG. 13 shows a perspective view of FIG. 12.

FIG. 12 shows a sectional view of other embodiment of the magnetic head of the present invention and FIG. 13 shows a perspective view thereof. The magnetic head of the present embodiment basically comprises a superconductive ring 41 made of a superconductive material, a Josephson junction 42 for connecting the superconductive ring 41, and a through-hole 43 formed by the superconductive ring 41. A conductor 44 extends from the superconductive ring 41 which is supported by a support substrate 45. When a signal is to be reproduced by the present magnetic head, a plane 46 facing the recording medium is arranged to face the recording medium 47 so that a magnetic flux generated by the recording medium 47 passes through the through-hole 43. The current flowing through the conductor 44 changes in accordance with the amount of magnetic flux so that the amount of magnetic flux is detected. In the magnetic head of the present embodiment, the width W of the rectangular through-hole 43 of the superconductive ring 41 corresponds to a track width, and the length l thereof corresponds to a pole thickness of a conventional perpendicular recording single magnetic pole head or a gap length of a conventional ring head.

In the conventional magnetic head, the narrower the track width is and the smaller the pole thickness or gap length are, the lower is the reproducing sensitivity. Accordingly, there is a limit in the increase of the track density and the linear recording density. In the magnetic head of the present embodiment, the reproduced signal can be detected if the amount of magnetic flux passing through the through-hole 43 is at least $1 \times 10^{-16}$ Wb. Accordingly, the present magnetic head is very highly sensitive and hence the track width W and the hole length l may be very small. Thus, the track density and the linear recording density are significantly improved.

In the magnetic head of the present embodiment, unlike a conventional inductive magnetic head, the reproduced output is independent from a relative speed between the head and the tape. Accordingly, it is advantageously used at a low relative speed with a high linear recording density. The manufacture of the head is easier because no coil is needed as is done in the inductive magnetic head. In a conventional magneto-resistive magnetic head, it is necessary to cover a magnetic sensor by a magnetic shield to prevent a leakage magnetic flux other than that from recorded bits to be reproduced from penetrating into the magnetic sensor. In the magnetic head of the present embodiment, the superconductive ring 41 itself serves as a very effective magnetic shield to shield the magnetic flux other than that from the recorded bits to be reproduced so that it does not penetrate into the through-hole 43. The support substrate 45 made of a non-magnetic insulative material serves to support the superconductive ring 41. By mounting a cooling element which utilizes the Peltier effect or the like in on support substrate 45, the superconductive ring 41 is efficiently cooled and stably kept in the superconducting state. A high permeability material such as Mn—Zn ferrite may be used as the support substrate 45 so that the magnetic flux passing through the through-hole 43 is directed to the high permeability material to improve the reproducing efficiency. Nothing may be filled in the through-hole 43 or a non-magnetic insulative material such as $SiO_2$, $Al_2O_3$ or glass may be filled in order to prevent dust from entering.

FIG. 14 shows an embodiment of the magnetic head of the present invention in which a biasing coil 49 is used. FIG. 15 shows an A–A' sectional view of the magnetic head of FIG. 14. In the present embodiment, the biasing coil 49 is arranged between the superconductive ring 41 and the support substrate 45 so that the biasing coil 49 links to the magnetic flux passing through the through-hole 43, an AC biasing current is supplied to the biasing coil to facilitate the signal detection. The biasing coil 49 may be provided at a projection 45A of the support substrate 45 as shown in FIG. 16. In the present embodiment, the superconductive ring 41 and the support substrate 45 are joined by a joining material 50.

Figure 17:
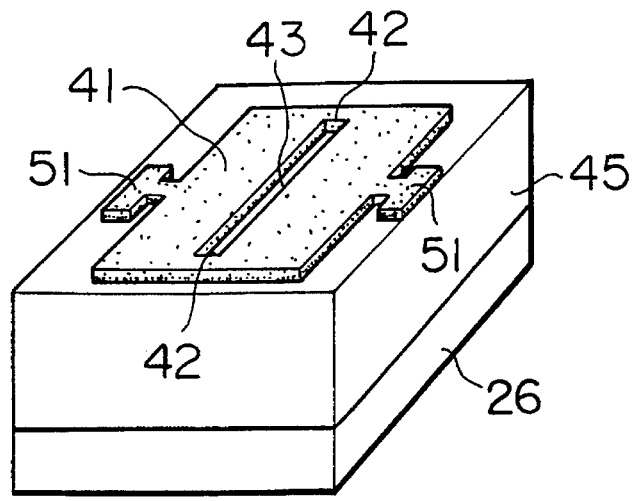
FIG. 17 shows a perspective view of other embodiment of the magnetic head of the present invention.

FIG. 17 shows other embodiment of the magnetic head of the present invention. Although FIGS. 13 and 14 show examples of magnetic heads using a DC type superconducting quantum interference device having two Josephson junctions 42 included in the superconductive ring 41, in FIG. 14, it is possible to use an AC type superconducting quantum interference device by using a single Josephson junction 42 and by replacing the biasing coil 49 with a high frequency coil. A superconductive thin film is formed on the support substrate 45 by a thin film forming method such as sputtering or vapor deposition, and unnecessary portions are removed by a thin film processing method such as ion milling or wet etching to form a through-hole 43 of a superconductive ring 41 and a terminal 51. In the present embodiment, a Josephson junction 42 is formed by reducing the width of the superconductive thin film. The magnetic head is completed by coupling a conductor to the terminal 51. In the magnetic head of the present embodiment, since the film-like superconductive ring 41 faces the recording medium, the superconductive ring 41 may be broken or worn by the contact or slide to the medium. Such break or wear may be prevented by depositing hard non-magnetic insulative material such as $SiO_2$, $Al_2O_3$ or BN on the superconductive ring 41 as a protective layer.

The magnetic recording and reproducing apparatus of the present invention is now explained by the preferred embodiments.

Figure 18A:
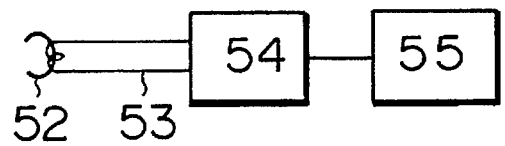
FIG. 18A shows a block diagram of one embodiment of a magnetic recording and reproducing apparatus of the present invention.

FIG. 18A shows a block diagram of the magnetic recording and reproducing apparatus of the present invention. A signal from a recording medium is reproduced by a magnetic head 52, and a reproduced signal current is supplied to a signal transfer line 53 and a superconducting quantum interference device 54. A signal transformed in accordance with the reproduced signal current is detected by a detection circuit 55.

Figure 18B:
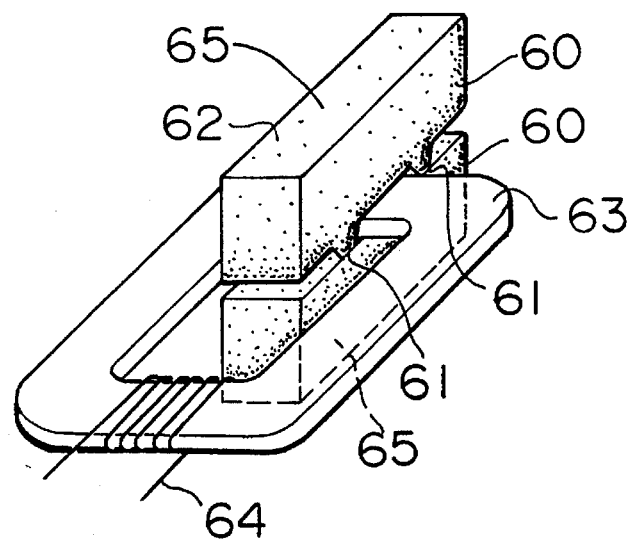
FIG. 18B shows a perspective view of one embodiment of a superconducting quantum magnetic flux interference device used in the magnetic recording and reproducing apparatus of the present invention.

FIG. 18B shows an embodiment of a DC superconducting quantum interference device used in the magnetic recording and reproducing apparatus of the present invention. A superconductive ring 62 is formed by a superconductive material 60 and two Josephson junctions 61, a magnetic ring 63 such as a ferrite ring is inserted into the superconductive ring 62, and a winding 64 for supplying a signal from the magnetic head is wound on the magnetic material ring 63. A signal detection line 65 extends from the superconductive ring 62. A small signal from the magnetic head is transformed to a magnetic flux flowing through the magnetic material ring 63, and the current flowing through the signal detection line 65 is modulated by the amount of magnetic flux flowing through the magnetic material ring 63. Since the current flowing through the superconductive ring 62 is sensitively modified by even a very small amount of magnetic flux passing through the superconductive ring 62, the small signal from the head can be detected by using the superconducting quantum interference device.

Figure 19A:
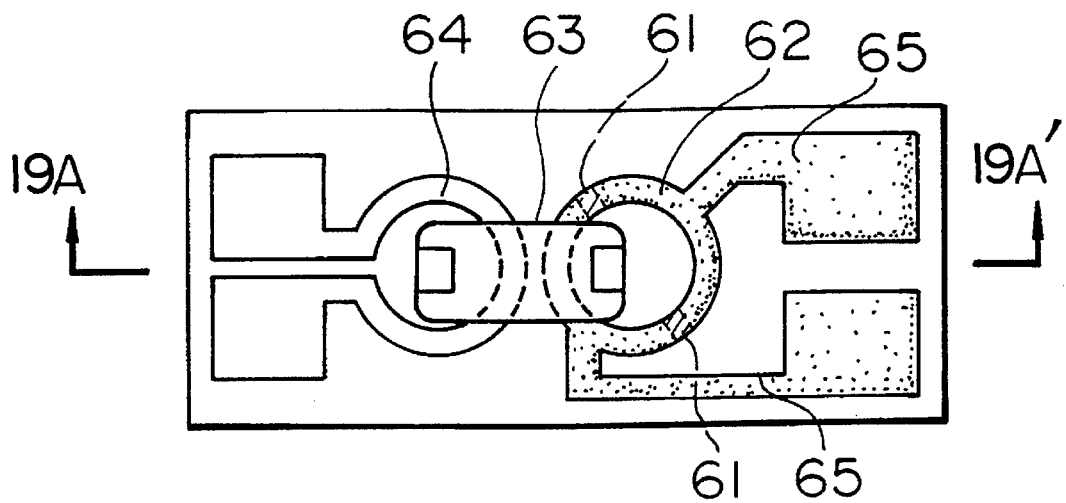
FIG. 19A shows a plan view of other embodiment of the superconducting quantum magnetic flux interference device used in the magnetic recording and reproducing apparatus of the present invention.
Figure 19B:
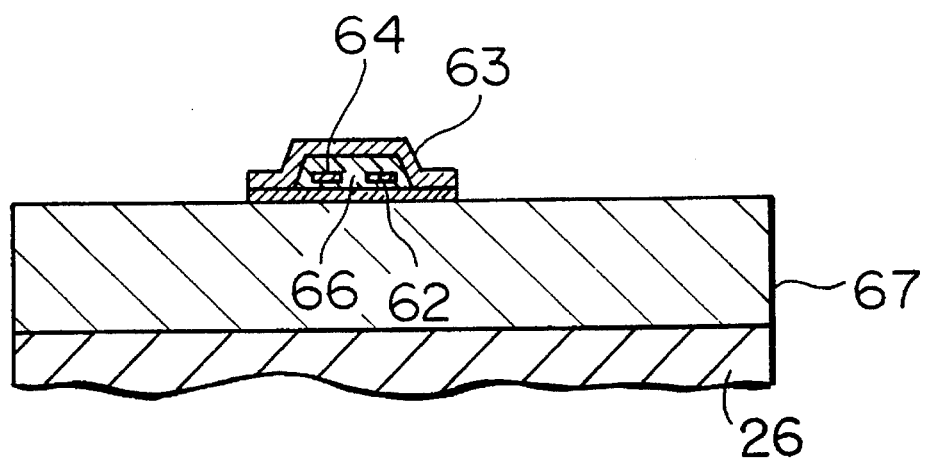
FIG. 19B shows an A–A' sectional view of FIG. 19A.

FIGS. 19A and 19B show other embodiment of the DC superconducting quantum interference device used in the magnetic recording and reproducing apparatus of the present invention. FIG. 19A shows a plan view and FIG. 19B shows an A–A' sectional view of FIG. 19A. Like in FIG. 18, it comprises a superconductive ring 62 of a superconductive material, a Josephson junction 61, a magnetic material 63, a winding 64 and a signal detection line 65. Numeral 66 denotes an insulative material. In the present embodiment, the superconducting quantum interference device is formed on the substrate 67. By arranging a cooling element which utilizes the Peltier effect on the substrate, the superconductive material portion can be efficiently cooled.

Figure 20A:
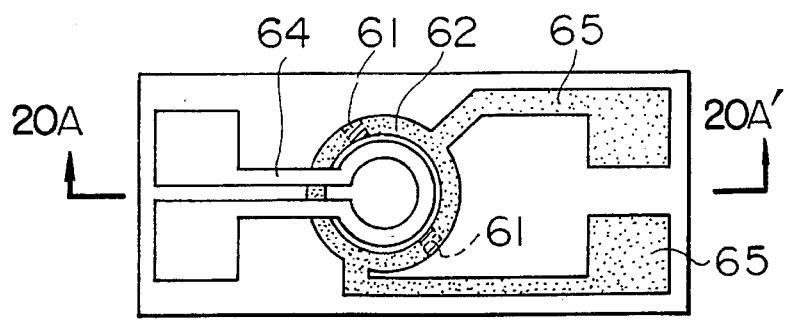
FIG. 20A shows a plan view of other embodiment of the superconducting quantum magnetic flux interference device used in the magnetic recording and reproducing apparatus of the present invention.
Figure 20B:
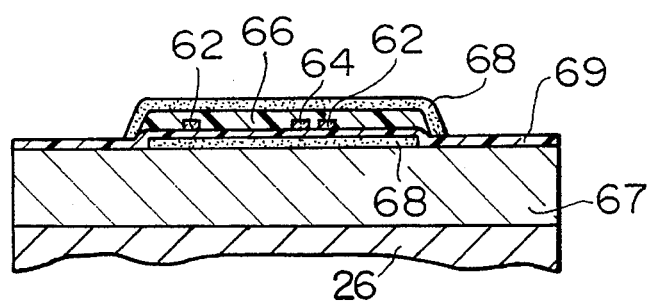
FIG. 20B shows an A–A' sectional view of FIG. 20A.

FIGS. 20A and 20B show other embodiment of the DC superconducting quantum interference device used in the magnetic recording and reproducing apparatus of the present invention. FIG. 20A shows a plan view and FIG. 20B shows an A–A' sectional view of FIG. 20A. In the present embodiment, the magnetic material ring 63 is omitted, and the winding 64 for supplying the signal from the magnetic head and the superconductive ring 62 are directly coupled. Since the superconducting quantum interference device has a very high sensitivity to a magnetic flux, the arrangement of the present embodiment is permitted. As shown in FIG. 20B, a magnetic shield 68 is provided to cover the superconductive ring 62 to prevent the leakage magnetic flux from the external and noise due to electromagnetic wave. The material of the magnetic shield may be a conventional high permeability material but a superconductive material is preferable in enhancing the shield effect. Insulative materials 66 and 69 are provided to insulate the shield material and the superconductive ring, and the winding. In FIG. 20A, the magnetic shield 68 and the insulative material 66 shown in FIG. 20B are omitted.

Figure 21A:
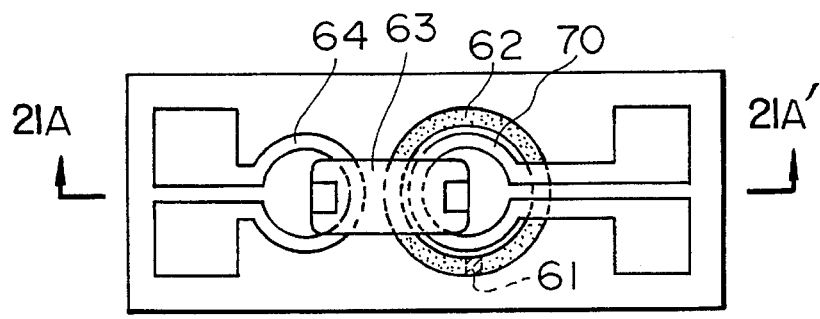
FIG. 21A shows a plan view of other embodiment of the superconducting quantum magnetic flux interference device used in the magnetic recording and reproducing apparatus of the present invention.
Figure 21B:
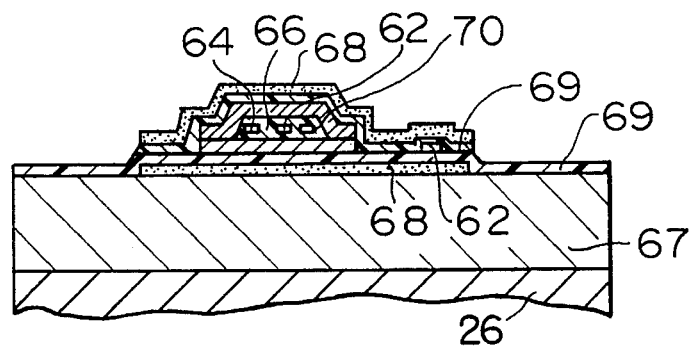
FIG. 21B shows an A–A' sectional view of FIG. 21A.

FIGS. 21A and 21B show an embodiment of an AC superconducting quantum magnetic flux interference device used in the magnetic recording and reproducing apparatus of the present invention. FIG. 21A shows a plan view and FIG. 21B shows an A–A' sectional view of FIG. 21A. The present embodiment comprises a superconductive ring 62 including a Josephson junction 61, a magnetic material ring 63, a winding 64 and an RF coil 70 for detecting a signal. A magnetic shield 68 is arranged to cover the superconductive ring 62. In FIG. 21A, the magnetic shield 68 and the insulative material 69 shown in FIG. 21B are omitted.

While the winding 64 and the RF coil 70 shown are of one-turn, they may be of multi-turn.

Figure 22A:
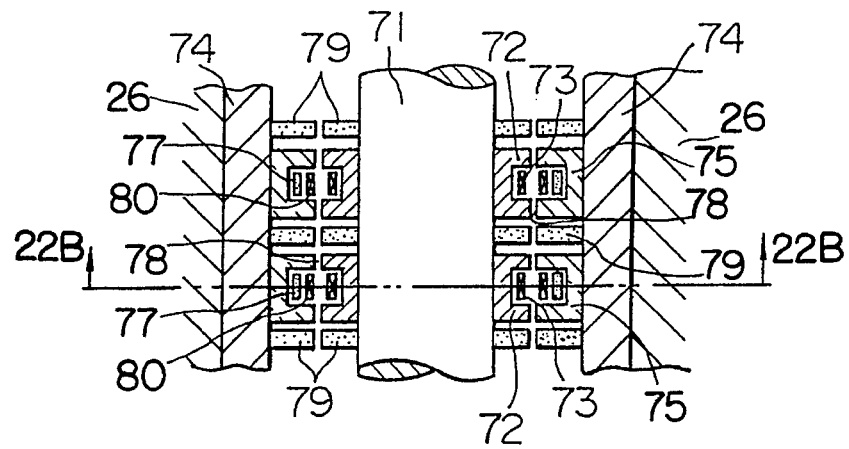
FIG. 22A shows a sectional view of an embodiment of a rotating superconducting quantum magnetic flux interference device of the present invention.
Figure 22B:
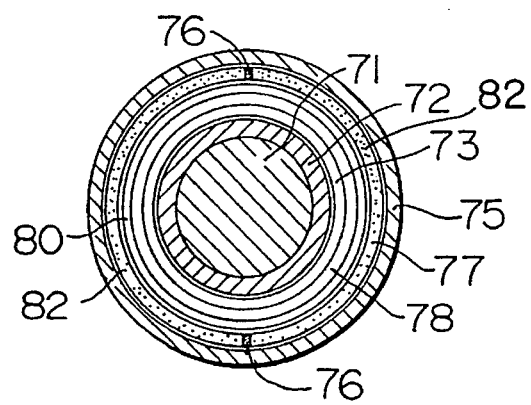
FIG. 22B shows a B–B' sectional view of FIG. 22A.

FIGS. 22A and 22B show an embodiment in a magnetic recording and reproducing apparatus such as a VTR having a head mounted on a rotary cylinder to record and reproduce signals on and from a tape, in which a superconducting quantum interference device is used in a rotary transformer used to transfer the signal. FIG. 22A shows a sectional view on a center of rotation shaft of the cylinder, and FIG. 22B shows a B–B' sectional view of FIG. 22A. In the present embodiment, a portion which rotates with the cylinder rotation shaft comprises a rotating magnetic material ring 72 and a winding for transmitting a signal from the magnetic head, and a portion fixed to a stator 74 comprises a stationary magnetic material ring 75 and a superconductive ring 77 including one or two Josephson junctions 76. The rotor portion and the stator portion form the superconducting quantum interference device. A gap 78 is provided between the rotor portion and the stator portion. By arranging a plurality of superconducting quantum interference devices along the rotation shaft, a plurality of signals can be transferred and detected. In order to magnetically separate the superconducting quantum interference devices from each other, magnetic shields 79 may be provided among the superconducting quantum interference devices. Furthermore, a winding 80 is arranged on the stator. Where the superconducting quantum magnetic interference device is the DC type and has two Josephson junctions, the winding 80 serves as a biasing coil. Where the superconducting quantum magnetic interference device is the AC type and has one Josephson junction, the winding 80 serves as a signal detection RF coil. In a signal reproduction mode, a magnetic flux is induced in the rotating magnetic material ring 72 by a signal current flowing through the winding 73, and the magnetic flux is transmitted to the stationary magnetic material ring 75 through the narrow gap 81. Since the magnetic flux penetrates into the superconductive ring 77, the signal is detected by a signal detection line 82 connected to the superconductive ring 77 for the DC type and the RF coil 80 for the AC type. In a signal record mode, a recording current is supplied to the winding 80 so that the recording signal may be transferred to the magnetic head side winding 73 of the rotary transformer as is done by the conventional rotary transformer.

Figure 23:
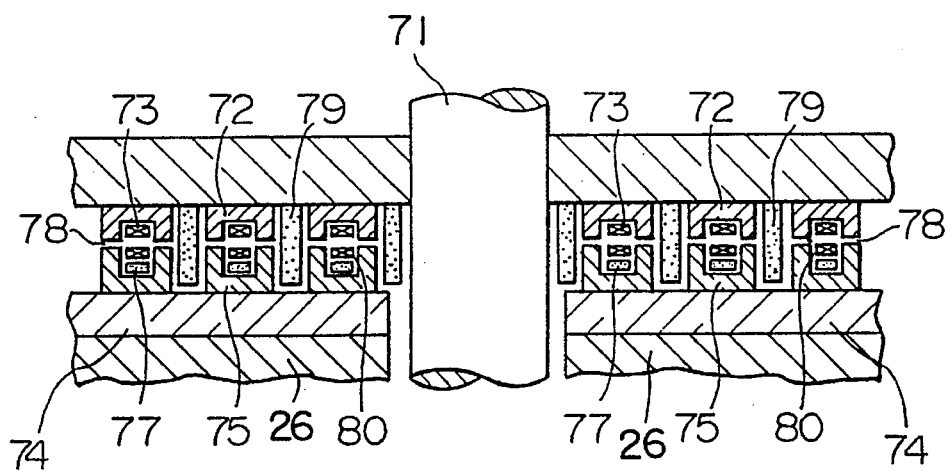
FIG. 23 shows a sectional view of other embodiment of the rotating superconducting quantum magnetic flux interference device of the present invention.

FIG. 23 shows other embodiment which uses the superconducting quantum magnetic flux interference device in place of the rotary transformer. Like the embodiment shown in FIG. 22A, it comprises a magnetic head side winding 73 and a rotary magnetic material ring 72 which are rotated with a cylinder rotation shaft 71, and a superconductive ring 77 and a stationary magnetic material ring 75 and a winding 80 which are fixed to stator 74. A magnetic shield 79 is fixed to either the rotor or the stator.

In the embodiment of FIG. 22A, it is necessary to increase the length of the shaft as the number of channels increases, and in the embodiment of FIG. 23, it is necessary to increase the diameter as the number of channels increases. Either of the embodiments may be used depending on the application. By mounting a cooling element which utilizes the Peltier effect in the stator 74, the superconductive material portion can be efficiently cooled.

By the use of the superconducting quantum interference device, a high recording density and very small signal can be reproduced and the magnetic head is insensitive to the external noise and generates less heat in the record mode.

In the magnetic recording and reproducing apparatus, the superconducting quantum interference device is used for detecting the signal from the magnetic head so that a very small reproduced signal can be detected and high density magnetic recording is permitted. In an apparatus such as VTR in which the head is mounted on a rotating cylinder, the superconducting quantum interference device is used in place of the rotary transformer so that high sensitivity signal reproduction is attained.

We claim:

1. A thin film magnetic head for at least enabling reproduction of a signal from a magnetic recording medium indicative of information recorded in the magnetic recording medium, the thin film magnetic head comprising:

a magnetic substrate;

an insulating layer formed over the substrate;

a magnetic pole disposed on said substrate, said substrate and magnetic pole having one side thereof facing the magnetic recording medium for guiding magnetic flux of the magnetic recording medium so as to enable reproduction of a signal indicative of information recorded in the magnetic recording medium; and a superconducting quantum interference device for detecting a signal based on the information recorded in the magnetic recording medium, said superconducting quantum interference device having a ring made of a superconductive state material including a Josephson junction directly linked to said magnetic pole, said ring being formed over said insulating layer and said magnetic pole overlaps at least a portion of said ring;

wherein said superconductive quantum interference device detects magnetic flux changes as an indication of the information recorded in the magnetic recording medium.

2. A magnetic head according to claim 1, wherein the magnetic head forms a part of at least a magnetic recording and reproducing apparatus for at least reproducing a signal indicative of the information recorded in the magnetic recorded medium.

3. A magnetic head according to claim 1, further comprising a protecting member formed at least on said one side of said magnetic pole and having one side facing the magnetic recording medium so as to enable sliding movement together with the one side of said substrate and said magnetic pole on the magnetic recording medium.

4. A thin film magnetic head comprising:

a magnetic substrate;

an insulating layer formed over said substrate;

a superconducting quantum interference device which includes a ring of superconductive state material having a Josephson junction, said ring being formed over said insulating layer; and a magnetic pole formed over said substrate and which overlaps at least a portion of said ring;

wherein said superconducting quantum interference device detects magnetic flux changes in said magnetic pole.

5. A magnetic head according to claim 4 wherein said ring includes two Josephson junctions and said superconducting quantum interference device is of DC type.

6. A magnetic head according to claim 5 further comprising a biasing coil arranged to magnetically couple to said ring of the superconductive state material to facilitate the detection of a signal.

7. A magnetic head according to claim 6 further comprising means for supplying a current to said biasing coil for applying a recording magnetic flux to said magnetic pole.

8. A magnetic head according to claim 4 wherein said ring includes one Josephson junction and said superconducting quantum interference device is of AC type and includes a signal detecting RF coil magnetically coupled to said ring.

9. A magnetic head according to claim 8 further comprising means for supplying a current to said RF coil for applying a recording magnetic flux to said magnetic pole.

10. A magnetic head according to claim 4 wherein said magnetic pole is of ring type.

11. A magnetic head according to claim 4 wherein said magnetic pole is of single magnetic pole type.

12. A magnetic head according to claim 4 further comprising a cooling element for cooling a portion made of the superconductive state material.

13. A magnetic head according to claim 4 further comprising a magnetic shield member arranged around at least one of said magnetic pole and said ring of the superconductive state material.

14. A magnetic head according to claim 13 wherein said magnetic shield member is made of a superconductive state material.

15. A magnetic head according to claim 4, wherein said magnetic pole has a side facing a magnetic recording medium and is arranged for guiding magnetic flux of the magnetic recording medium.

16. A magnetic head according to claim 15 further comprising a recording coil arranged to link to said magnetic pole for applying a recording magnetic flux to said magnetic recording medium through said magnetic pole.

17. A magnetic head according to claim 16 wherein said recording coil is made of a superconductive state material.

18. A thin film magnetic head comprising:

a magnetic substrate;

an insulating layer formed over said substrate;

a superconducting quantum interference device which includes a ring of superconductive state material having a Josephson junction, said ring being formed over said insulating layer;

a first magnetic pole formed over said substrate;

a magnetic flux transfer coil linked to said first magnetic pole and to a second magnetic pole, said second magnetic pole being formed over said substrate and overlapping at least a portion of said ring;

wherein said superconducting quantum interference device detects magnetic flux changes at least in said second magnetic pole.

19. A magnetic recording and reproducing apparatus comprising:

a magnetic head facing a magnetic recording medium;

a winding to which a reproduced signal from said magnetic head is supplied;

a superconducting quantum interference device having a superconductive state material ring including a Josephson junction arranged such that magnetic flux generated by said winding penetrates thereto; and a magnetic material ring inserted in said superconductive state material ring wherein said winding to which the reproduced signal from the magnetic head is supplied is wound on said magnetic material ring.

20. A magnetic recording and reproducing apparatus according to claim 19 wherein said superconductive state material ring has two Josephson junctions and said superconducting quantum interference device is of DC type.

21. A magnetic recording and reproducing apparatus according to claim 19 wherein said superconductive state material ring has one Josephson junction and said superconducting quantum interference device is of AC type having a signal detecting RF coil magnetically coupled to said ring.

22. A magnetic recording and reproducing apparatus according to claim 19 further comprising a magnetic shield for covering said superconductive state material ring.

23. A magnetic recording and reproducing apparatus according to claim 22 wherein said shield material is made of a superconductive state material.

24. A magnetic recording and reproducing apparatus according to claim 19 further comprising means for cooling the superconductive state material portion.

25. A magnetic recording and reproducing apparatus comprising:

a magnetic head facing a magnetic recording medium;

a winding to which a reproduced signal from said magnetic head is supplied;

a superconductive quantum interference device having a superconductive state material ring including a Josephson junction arranged such that magnetic flux generated by said winding penetrates thereto; and a cylinder rotation shaft;

wherein said winding is arranged coaxially with said cylinder rotation shaft and rotates with said cylinder rotation shaft, and said superconductive state material ring of said superconductive quantum interference device is arranged on a stator with a small spacing from said winding.

26. A magnetic recording and reproducing apparatus according to claim 25 further comprising a rotating magnetic material ring rotated with said cylinder rotation shaft and a stationary magnetic material ring fixed to the stator, wherein a magnetic flux induced in the rotating magnetic material ring by said winding is transferred to said stationary magnetic material ring through the small gap.

27. A magnetic recording and reproducing apparatus according to claim 26 wherein said stator has a winding magnetically coupled to said superconductive state material ring.

28. A magnetic recording and reproducing apparatus according to claim 27 wherein a recording current is supplied to said winding in a record mode.

29. A magnetic recording and reproducing apparatus according to claim 25 wherein a plurality of windings and a plurality of superconducting quantum interference devices are arranged on said cylinder rotation shaft to permit transfer and detection of at least two signals.

30. A magnetic recording and reproducing apparatus according to claim 29 wherein a magnetic shield is provided between each winding and each superconducting quantum interference device.

* * * * *